(12) United States Patent
Li et al.

(10) Patent No.: US 9,386,201 B2
(45) Date of Patent: Jul. 5, 2016

(54) ELECTRONIC APPARATUS AND CAMERA DEVICE THEREOF

(71) Applicant: Molex, LLC, Lisle, IL (US)

(72) Inventors: Chun Guang Li, Shanghai (CN); Tong Lye Ng, Singapore (SG)

(73) Assignee: Molex, LLC, Lisle, IL (US)

( * ) Notice: Subject to any disclaimer, the term of this patent is extended or adjusted under 35 U.S.C. 154(b) by 0 days.

(21) Appl. No.: 14/155,555

(22) Filed: Jan. 15, 2014

(65) Prior Publication Data

US 2014/0307162 A1 Oct. 16, 2014

(30) Foreign Application Priority Data

Jan. 15, 2013 (CN) ...................... 2013 2 0020827 U

(51) Int. Cl.
*H04N 5/225* (2006.01)

(52) U.S. Cl.
CPC ........... *H04N 5/2253* (2013.01); *H04N 5/2257* (2013.01)

(58) Field of Classification Search
CPC .. H04N 5/2251; H04N 5/2253; H04N 5/2257
See application file for complete search history.

(56) References Cited

U.S. PATENT DOCUMENTS

| 6,768,516 | B2 | 7/2004 | Yamada et al. | |
|---|---|---|---|---|
| 2004/0041938 | A1 | 3/2004 | Seo et al. | |
| 2006/0258179 | A1* | 11/2006 | Watanabe | 439/55 |
| 2009/0040368 | A1* | 2/2009 | Lin et al. | 348/374 |
| 2009/0303360 | A1* | 12/2009 | Huang | 348/294 |
| 2010/0243872 | A1* | 9/2010 | Amano | 250/238 |

FOREIGN PATENT DOCUMENTS

CN 101630115 A 1/2010

* cited by examiner

*Primary Examiner* — Daniel M Pasiewicz
(74) *Attorney, Agent, or Firm* — Stephen L. Sheldon

(57) ABSTRACT

The present disclosure relates to a camera device and an electronic device. The camera device comprises a rigid circuit board, an image sensor, and a heat dissipation member. The rigid circuit board comprises an extension portion extending laterally and a plurality of electrical contact pads. The extension portion comprises a board edge. The plurality of electrical contact pads are provided on the board edge. The image sensor comprises an image capture chip. The image capture chip may be directly fixed on the rigid circuit board, a heat dissipation space is left at a position which is below the rigid circuit board and corresponds to the image sensor when the board edge of the rigid circuit board is mated to a board edge connector of laterally connected type provided at one side of a main circuit board. The heat dissipation member may be provided in the heat dissipation space.

2 Claims, 10 Drawing Sheets

ELECTRONIC APPARATUS AND CAMERA DEVICE THEREOF

RELATED APPLICATIONS

This application claims priority to Chinese Application No. 201320020827.X, filed Jan. 15, 2013, which is incorporated herein by reference in its entirety.

TECHNICAL FIELD

The present disclosure relates to an electronic device and a camera device suitable for use therewith.

BACKGROUND ART

A common camera module comprises a casing, an image capture chip, a circuit board and other components (such as lens unit and the like) which are integrally packaged to a camera module, typically, the circuit board is slight larger than the image capture chip, the image capture chip is fixed on the circuit board and electrically connected with the circuit board. The assemble of the entire camera module and an electronic device can have the circuit board at the bottom surface of the camera module soldered to another flexible wiring board, and connected with other electronic elements of the electronic device via the flexible wiring board; or the entire camera module is provided into a connector, and connected with the electronic device via a terminal of the connector.

U.S. Pat. No. 6,768,516 discloses a semiconductor device of an existing CMOS camera system. A CMOS camera module comprises a stepped wiring board. The stepped wiring board is provided on a flexible wiring board. The stepped wiring board has an image pick-up opening, a lens is provided above the image pick-up opening, the stepped wiring board is formed with a recess below the image pick-up opening. The recess comprises steps, the pick-up semiconductor device is connected to one step in the recess by means of flip-chip bonding, an image processing semiconductor device is connected to another step. The flexible wiring board is electrically connected to a mother board via an electrical connector.

U.S. patent application publication No. 2004/0041938 discloses another existing embedded type camera module. The embedded type camera module comprises an image sensor chip and a transparent plate. The transparent plate is formed with a circuit pattern thereon, an image capture chip is provided on the transparent plate to be electrically connected with the circuit pattern, the light enters into the image capture chip by the transparent plate.

As a higher demand for image quality, the pixel of the camera module is increasing accordingly, and the mode of the operation tends to be high-ordered and complicated, thereby making the camera module generate an increased amount of heat. Existing design of the camera module do not have a sufficient ability of heat dissipation and this inability to cool affects the output image quality. Thus, certain individuals would appreciate an improved system for supporting a camera module.

SUMMARY OF THE INVENTION

A camera device of an embodiment of the present disclosure comprises a rigid circuit board, an image sensor, and a heat dissipation member. The rigid circuit board comprises an extension portion extending laterally and a plurality of electrical contact pads. The extension portion comprises a board edge, the plurality of electrical contact pads are provided on the board edge. The image sensor comprises an image capture chip. The image capture chip may be directly fixed on the rigid circuit board, a heat dissipation space is left at a position which is below the rigid circuit board and corresponds to the image sensor when the board edge of the rigid circuit board is mated to a board edge connector in a right angle configuration provided at one side of a main circuit board. The heat dissipation member may be provided in the heat dissipation space.

The heat dissipation member can be positioned between a bottom surface of the rigid circuit board and an upper board surface of the main circuit board, and the board edge connector can be provided on the upper board surface of the main circuit board. The heat dissipation member can be beside the main circuit board.

The board edge of the rigid circuit board can be mated to the board edge connector provided on the upper board surface of the main circuit board, the rigid circuit board extends above the upper board surface, and protrudes out of an edge of the main circuit board, the image sensor can be positioned at the part of the rigid circuit board protruding out of the main circuit board.

The board edge of the rigid circuit board can be mated to the board edge connector provided on a lower board surface of the main circuit board, the rigid circuit board extends below the lower board surface, and protrudes out of an edge of the main circuit board, the image sensor is positioned at the part of the rigid circuit board protruding out of the main circuit board.

An embodiment of electronic device comprises a main circuit board, a board edge connector of laterally connected type (e.g., right angle connector), and a camera device. The board edge connector is provided on the main circuit board. The camera device comprises a rigid circuit board, an image sensor and a heat dissipation member. The rigid circuit board comprises an extension portion extending laterally and a plurality of electrical contact pads. The extension portion comprises a board edge. The plurality of electrical contact pads are provided at the board edge. The image sensor comprises an image capture chip. The image capture chip may be directly fixed on the rigid circuit board. A heat dissipation space is left at a position which is below the rigid circuit board and corresponds to the image sensor when the board edge of the rigid circuit board is mated to the board edge connector. The heat dissipation member is provided in the heat dissipation space.

The heat dissipation member can be positioned between a bottom surface of the rigid circuit board and an upper board surface of the main circuit board, and the board edge connector is provided on the upper board surface of the main circuit board. The electronic device can further comprise an outer casing, wherein the heat dissipation member is positioned between the outer casing and the rigid circuit board.

The board edge of the rigid circuit board is mated to the board edge connector provided on the upper board surface of the main circuit board, the rigid circuit board extends above the upper board surface, and protrudes out of an edge of the main circuit board, the image sensor is positioned at the part of the rigid circuit board protruding out of the main circuit board.

The board edge of the rigid circuit board is mated to the board edge connector provided on a lower board surface of the main circuit board, the rigid circuit board extends below the lower board surface, and protrudes out of an edge of the main circuit board, the image sensor is positioned at the part of the rigid circuit board protruding out of the main circuit board.

DETAILED DESCRIPTION OF THE PREFERRED EMBODIMENTS

Embodiments of the present disclosure are described in details in combination with the drawings. As can be appreciated, an object of the present disclosure is to disclose a new electronic device and a camera device thereof. Benefits of the present disclosure include the use of a rigid circuit board is used to directly fix the image capture chip and the board edge connector mated to the main circuit board at the same time, so that the camera device has a simpler configuration, which can reduce the used materials and the soldering steps and has a low occupied height and accomplish a low profile mounting. In addition, the rigid circuit board is laterally mated to the board edge connector, which can maintain a low profile and leave a space below the image sensor for facilitating the heat dissipation member to be mounted. Thus, the depicted embodiments provide a number of possible advantages.

It should be noted that, positional directions or movement directions (such as up, down, left, right, front, rear and the like) used for explaining structures or components of the embodiments of the present disclosure, are not absolute, but relative. When the disclosed component is the same as the embodiment of the accompanying figures in arrangement manner, these used directions may be appropriate. However, if the position or the reference coordinates of the disclosed embodiment change(s), the used direction will change accordingly.

Figure 1:
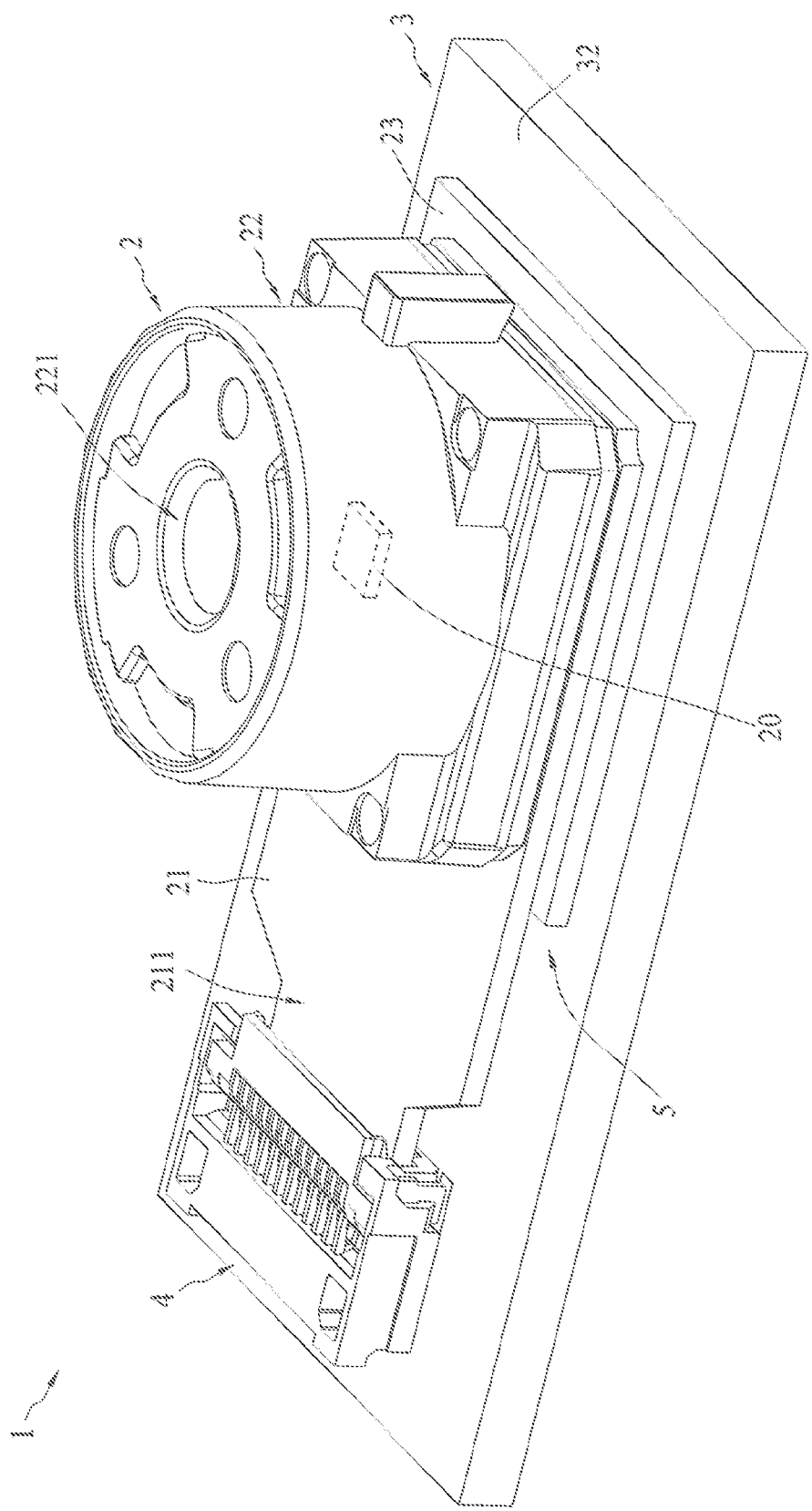
FIG. 1 is a perspective view of an embodiment of an electronic device.
Figure 2:
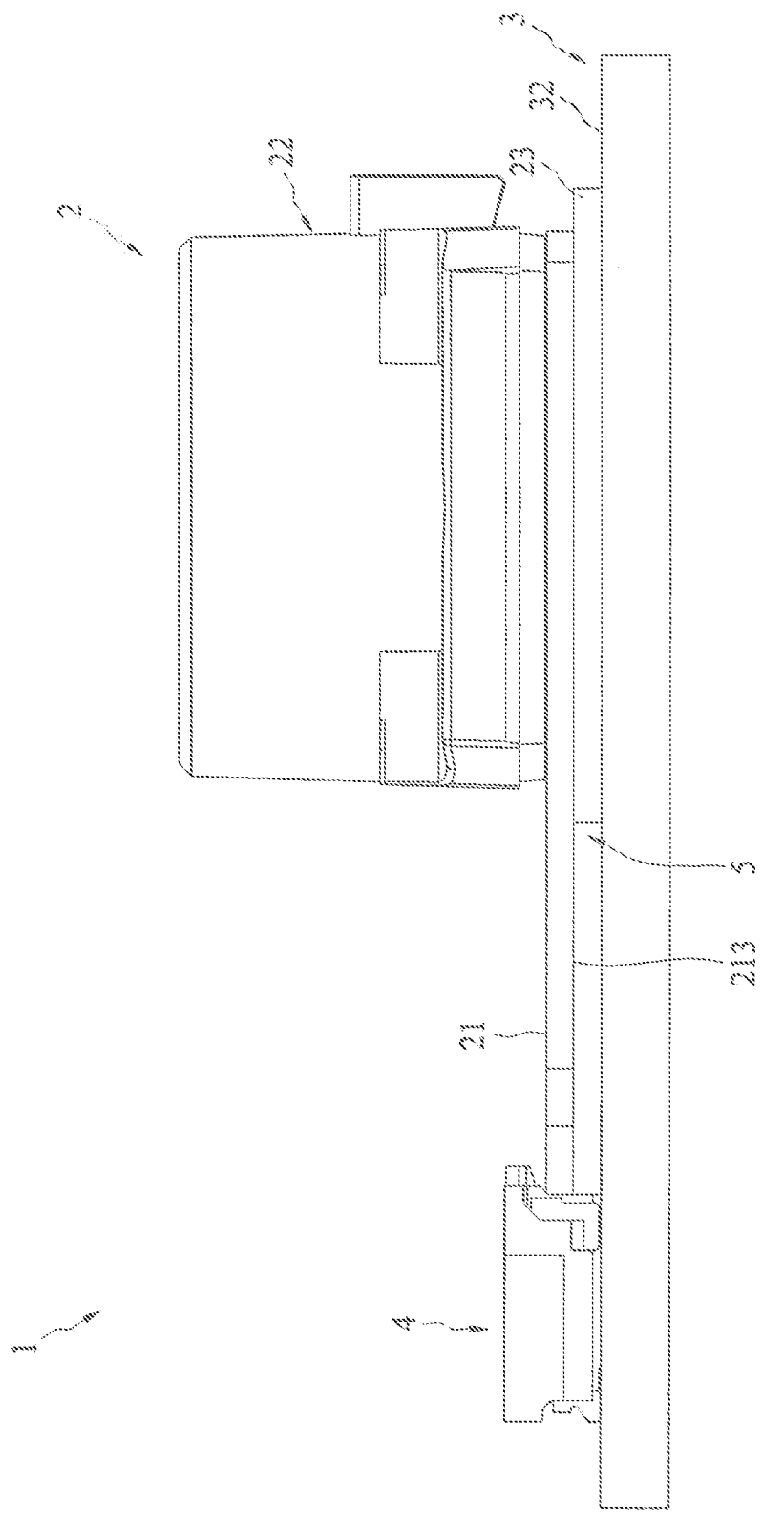
FIG. 2 is an elevated side view of the embodiment depicted in FIG. 1.

Referring to FIG. 1 and FIG. 2, the electronic device 1 comprises a camera device 2, a main circuit board 3, and a board edge connector 4. The board edge connector 4 may be provided on the main circuit board 3. The camera device 2 may be mated to the board edge connector 4, and electrically connected to the main circuit board 3 via the board edge connector 4.

In an embodiment, the electronic device 1 can be part of a portable electronic product, such as a laptop computer, a mobile phone, a tablet computer, a personal digital assistant and the like. In another embodiment, the electronic device 1 can be part of a non-portable electronic product.

Figure 3:
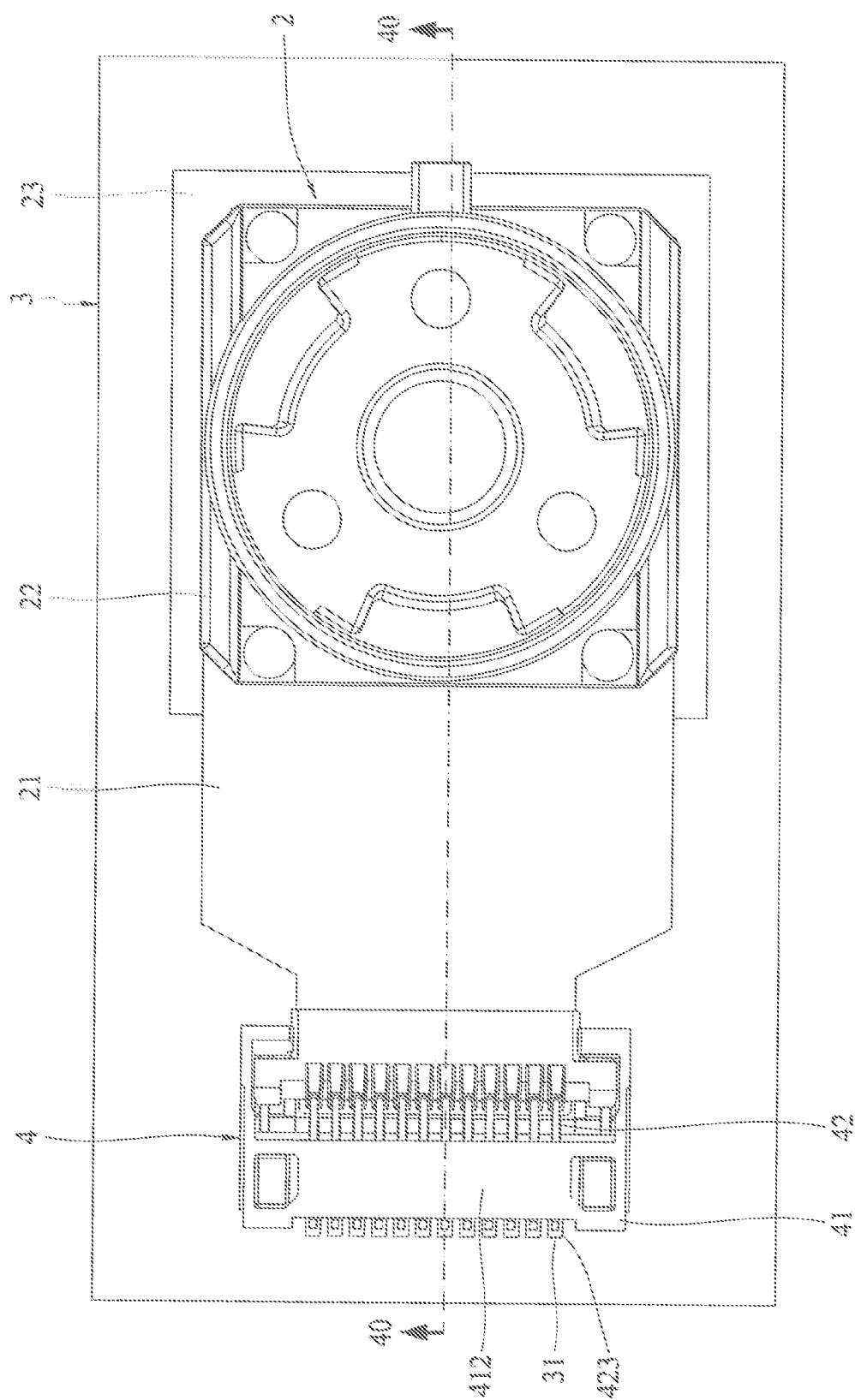
FIG. 3 is a top view of the embodiment depicted in FIG. 1.
Figure 4:
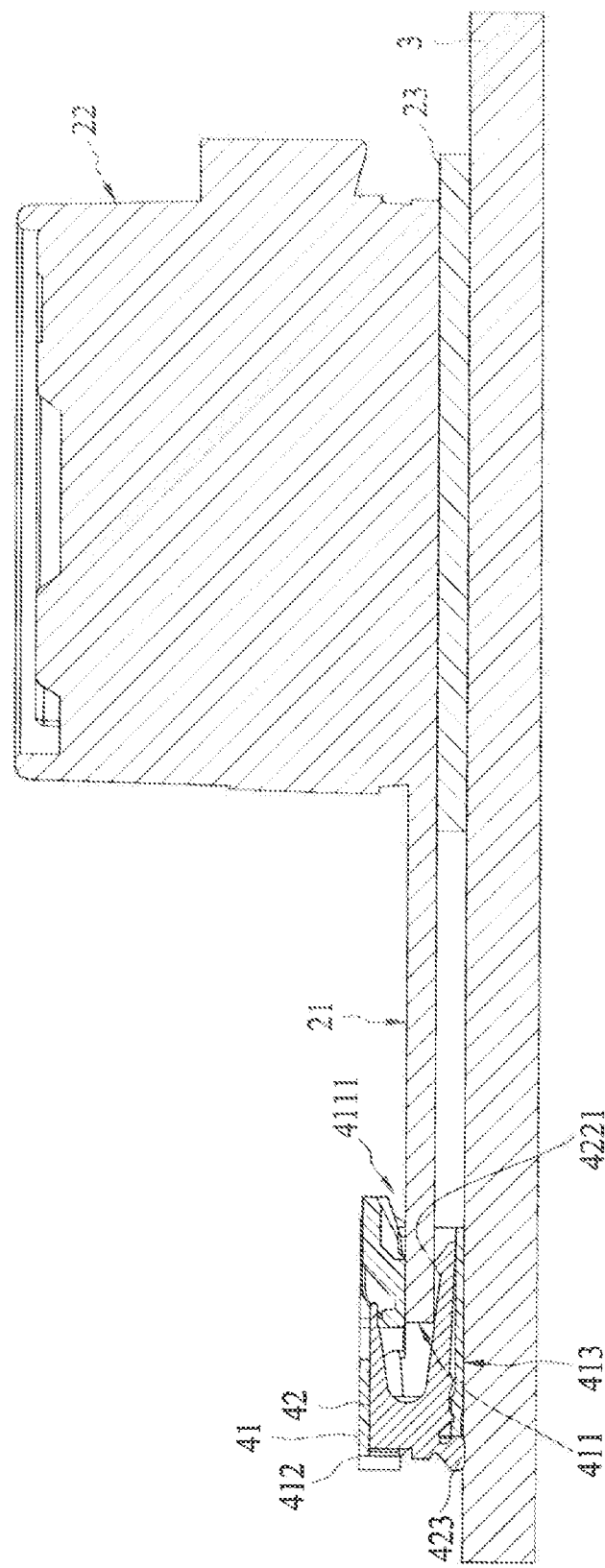
FIG. 4 is a sectional view taken along a line 40-40 of FIG. 3.
Figure 5:
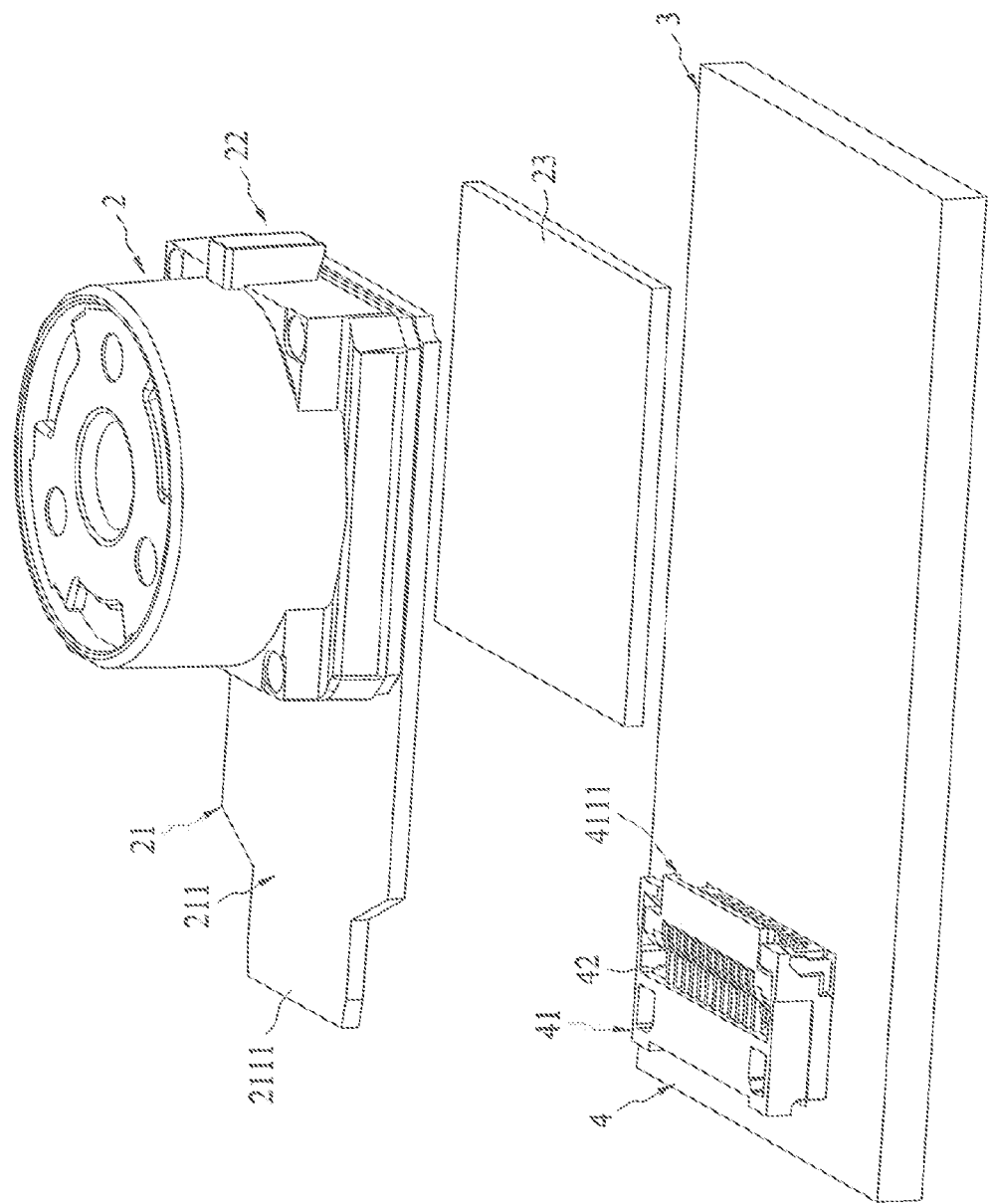
FIG. 5 is an exploded perspective view of the embodiment depicted in FIG. 1.

Referring to FIGS. 3-5, the board edge connector 4 may be a board edge connector in a right-angle configuration (as opposed to a vertical configuration). The board edge connector 4 comprises an insulative body 41 and a plurality of terminals 42, the plurality of terminals 42 are fixed to the insulative body 41. The insulative body 41 comprises a slot 411. The slot 411 has an entrance 4111, the entrance 4111 is positioned at a lateral side of the insulative body 41. Thus, the camera device 2 is mated to the slot 411 in a lateral manner.

Referring to FIG. 4, the insulative body 41 comprises a first surface 412 and a second surface 413, the second surface 413 is adjacent to the main circuit board 3, and the first surface 412 is opposite to the second surface 413. The terminal 42 may comprise a contact portion 4221 and a soldering portion 423. The contact portion 4221 is positioned in the slot 411 to contact with or electrically connect with the mated camera device 2.

As is shown in FIG. 3, the soldering portion 423 of the terminal 42 may be electrically connected with the main circuit board 3. In an embodiment, the main circuit board 3 comprises a plurality of electrical contact pads 31, the soldering portion 423 of the terminal 42 is soldered on the corresponding electrical contact pad 31. In another embodiment, the soldering portion 423 of the terminal 42 may be a pin-shaped configuration which may be inserted into a corresponding soldering via of the main circuit board 3. In another embodiment, the soldering portion 423 of the terminal 42 may be a pin-shaped configuration with a needle eye portion, thereby the soldering portion 423 of the terminal 42 can be pressed into a corresponding soldering via of the main circuit board 3.

Referring to FIG. 1, FIG. 3 and FIG. 5, the camera device 2 comprises a rigid circuit board 2, an image sensor 22, and a heat dissipation member 23, the image sensor 22 is provided on the rigid circuit board 21, and the heat dissipation member 23 is provided correspondingly to the image sensor 22 so as to conduct the heat generated by the image sensor 22.

Referring to FIG. 1, the image sensor 22 comprises an image capture chip 20. The image capture chip 20 is directly fixed on the rigid circuit board 21 and electrically connected with the rigid circuit board 21, so the image capture chip 20 and the rigid circuit board 21 may be considered as an integral package. In an embodiment, the image capture chip 20 may be fixed on the rigid circuit board 21 with an adhesive. In an embodiment, the adhesive may be a conductive adhesive, the image capture chip 20 is fixed on the rigid circuit board 21 with the conductive adhesive, and electrically connected with the rigid circuit board 21 with the conductive adhesive. In an embodiment, the image capture chip 20 is connected with the rigid circuit board 21 with a conductive wire. In an embodiment, the image capture chip 20 is soldered on the rigid circuit board 21. In an embodiment, the image capture chip 20 could be connected to the rigid circuit board 21 by means of flip-chip bonding.

Referring to FIG. 1, the image sensor 22 comprises a light incident surface 221, the light enters into the image sensor 22 from the light incident surface 221 to project on the image capture chip 20 to produce an image. In an embodiment, the image sensor 22 may comprise a lens, at least part of the lens face of the lens constitutes the light incident surface 221.

Figure 6:
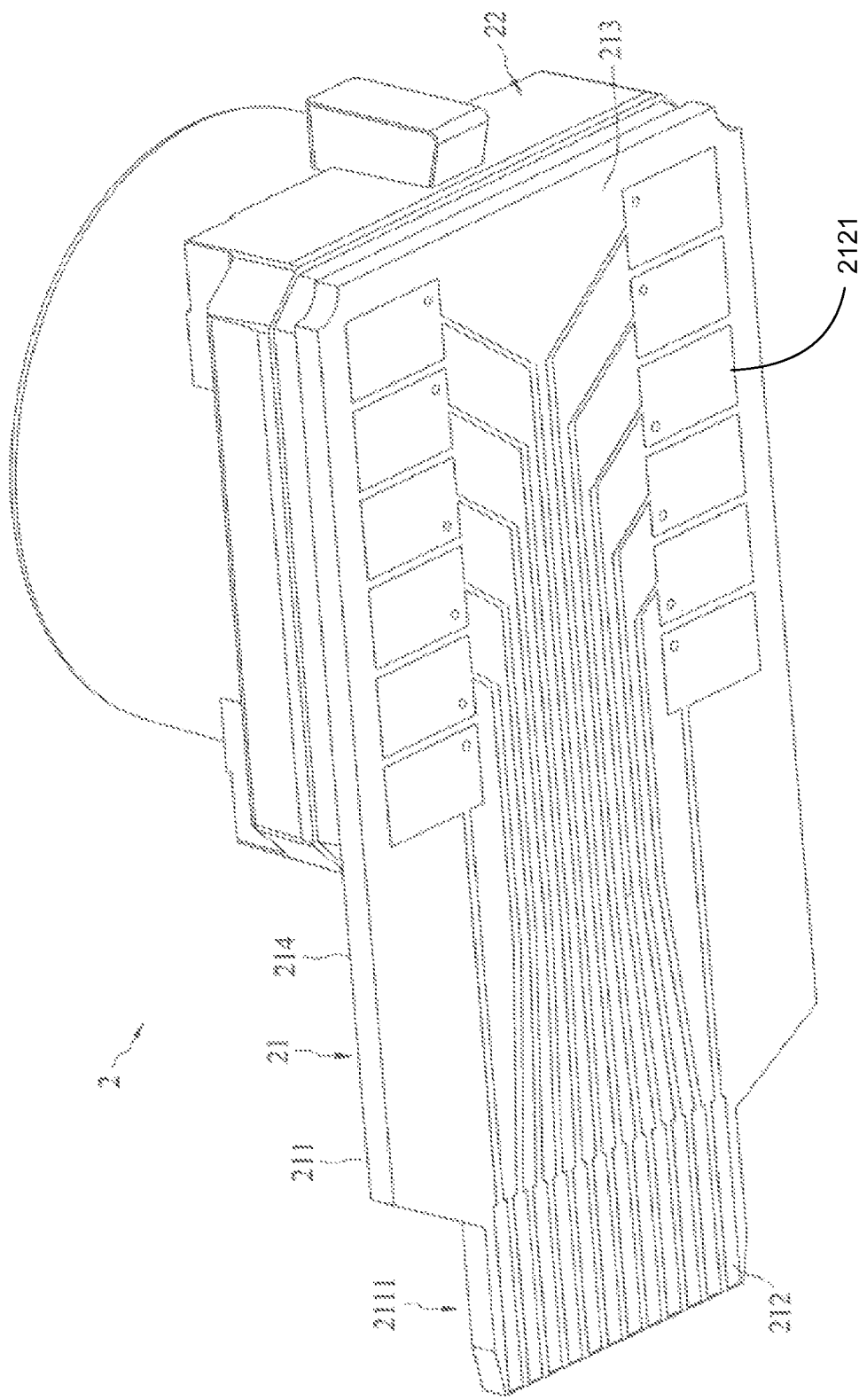
FIG. 6 illustrates a bottom perspective view of an embodiment of a camera device.

Referring to FIG. 5 and FIG. 6, the rigid circuit board 21 comprises an extension portion 211 and a plurality of electrical contact pads 212, the extension portion 211 extends laterally relative to the camera device 2. The extension portion 211 comprises a board edge 2111, a plurality of electrical contact pads 212 are provided on the board edge 2111. The board edge 2111 can be mated to the slot 411 from the entrance 4111 of the board edge connector 4. After the board edge 2111 is mated, the electrical contact pad 212 can contact the contact portion 4221 of the corresponding terminal 42. In an embodiment, as shown in FIG. 6, the electrical contact pad 212 and the image sensor 22 may be respectively provided at opposite two sides of the rigid circuit board 21, but the present disclosure is not limited to that. That is to say, the electrical contact pads 212 and associated circuitries thereof may be provided on a bottom surface 213 or an top surface 214, or the bottom surface 213 and the top surface 214 of the rigid circuit board 21. As depicted, the electrical contact pads 212 are electrically connected to bottom pads 2121 that are wider than the electrical contact pads 212.

Referring to FIG. 1 and FIG. 2, after the board edge 2111 of the rigid circuit board 21 is mated to the board edge connector 4, a heat dissipation space 5 may be left at a position which is below the rigid circuit board 2 and corresponds to the image sensor 22, to assist in heat dissipation from the image sensor 22. The heat dissipation member 23 may contains any heat dissipation material which may be filled or provided in the heat dissipation space 5. In an embodiment, the heat dissipation member 23 may be a heat dissipation adhesive or a heat dissipation paste. In another embodiment, the heat dissipation member 23 may be a thermal pad. In another embodiment, the heat dissipation member 23 may be a thermal tape.

Referring to FIG. 1, FIG. 2 and FIG. 6, the rigid circuit board 21 comprises the bottom surface 213, the main circuit board 3 comprises an upper board surface 32, the board edge connector 4 is provided on the upper board surface 32, the camera device 2 is positioned above the upper board surface 32, and the heat dissipation member 23 is positioned between the bottom surface 213 of the rigid circuit board 21 and the upper board surface 32 of the main circuit board 3. In an embodiment, the image capture chip 20 of the image sensor 22 comprises a CMOS, a charge coupled device or the like.

Figure 7:
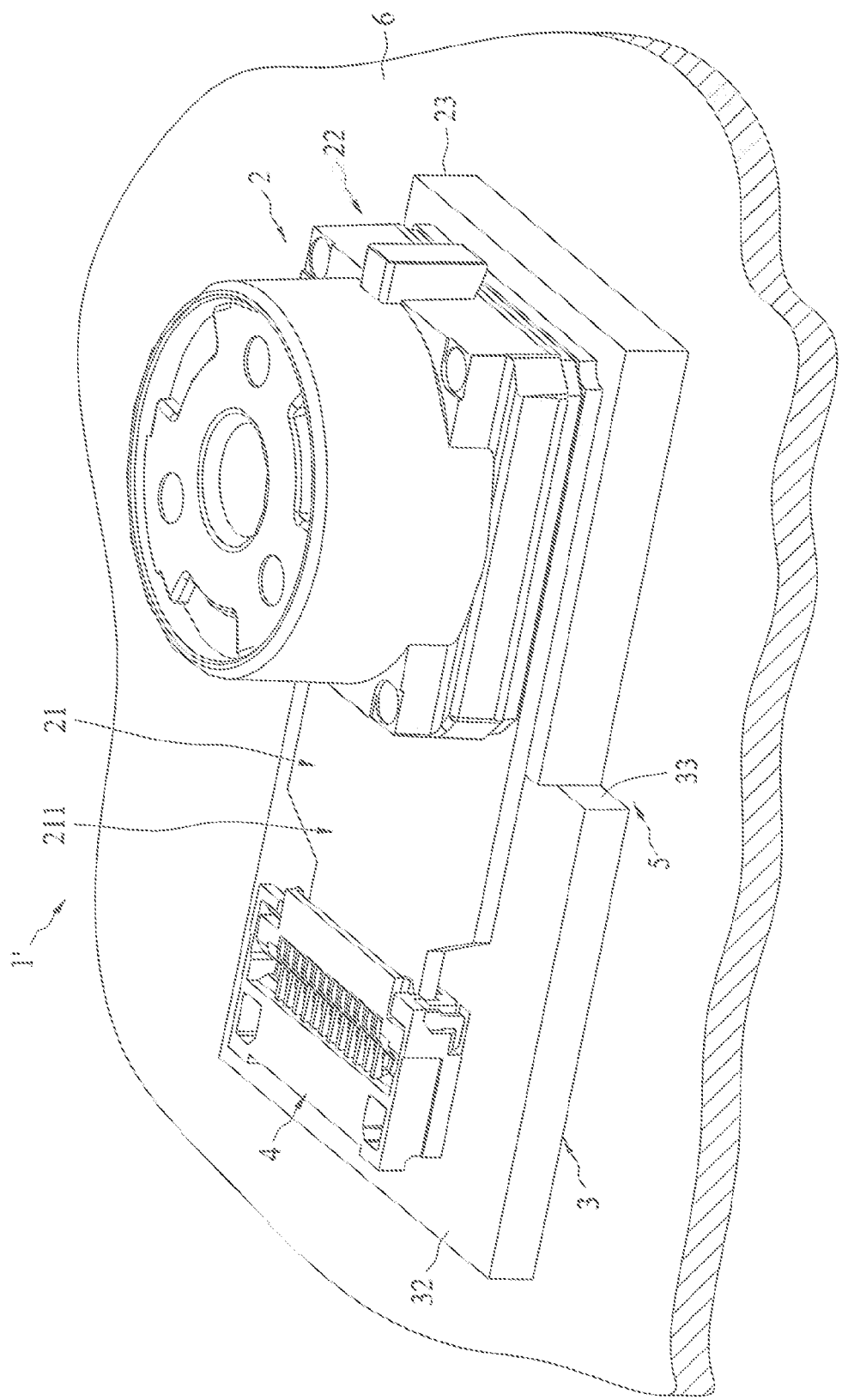
FIG. 7 is a perspective view of another embodiment of an electronic device.
Figure 8:
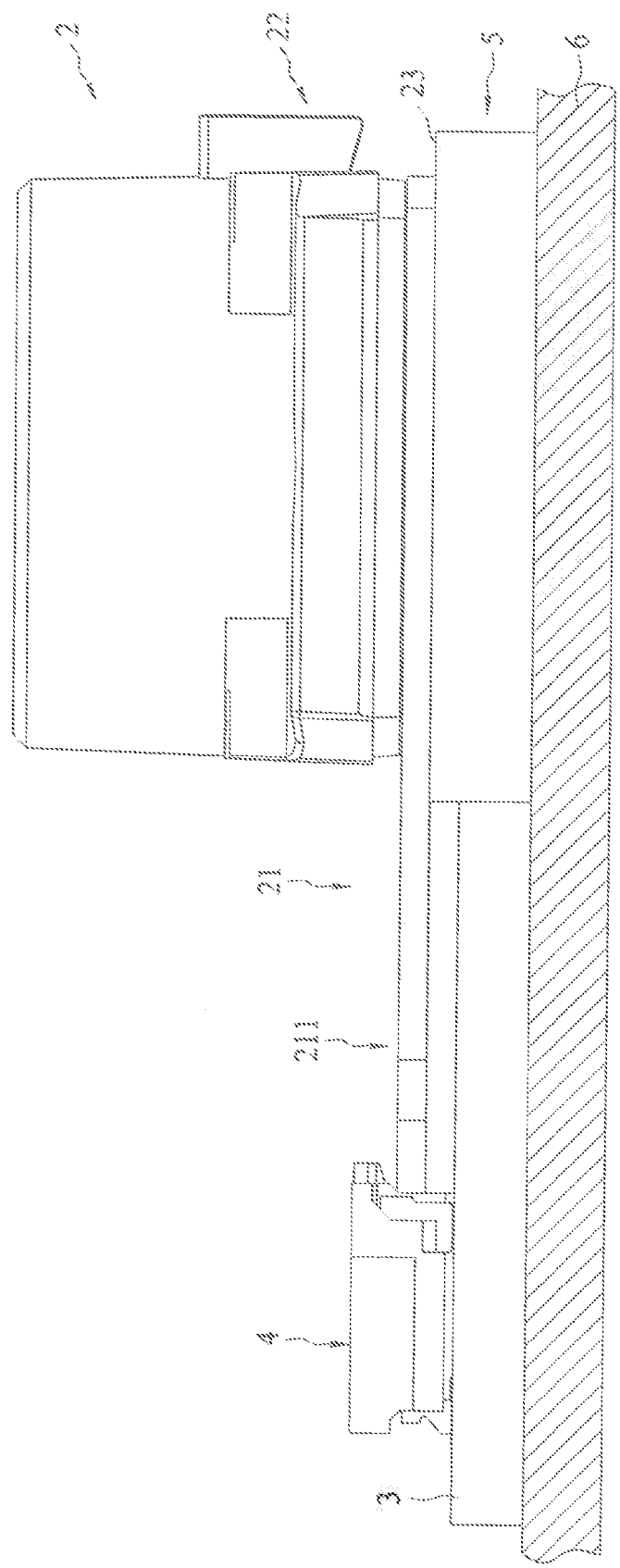
FIG. 8 is an elevated side view of the embodiment depicted in FIG. 7.

FIG. 7 is a perspective view of an embodiment of electronic device V. FIG. 8 is a side view of the electronic device V. Referring to FIG. 7 and FIG. 8, the electronic device 1' comprises a camera device 2, a main circuit board 3, and a board edge connector 4, the board edge connector 4 is provided on an upper board surface 32 of the main circuit board 3. The board edge connector 4 is provided on the main circuit board 3. The camera device 2 and the board edge connector 4 may be positioned at the same side of the main circuit board 3. After the rigid circuit board 21 of the camera device 2 is mated to the board edge connector 4, the rigid circuit board 21 extends toward an edge 33 of the main circuit board 3 on the upper board surface 32 of the main circuit board 3 to protrude out of the edge 33 of the main circuit board 3; the image sensor 22 of the camera device 2 is positioned on the part of the rigid circuit board 21 protruding out of the main circuit board 3 and is close to the edge 33 of the main circuit board 3; and a heat dissipation space 5 is left at a position which is blow the rigid circuit board 21 and corresponds to the image sensor 22. The heat dissipation member 23 is provided in the heat dissipation space 5 and positioned beside the edge 33 of the main circuit board 3.

In an embodiment, the electronic device 1' comprises an outer casing 6, the heat dissipation member 23 is positioned between the outer casing 6 and the rigid circuit board 21, therefore the heat generated by the camera device 2 can be conducted to the outer casing 6 to escape out of the electronic device 1'.

Figure 9:
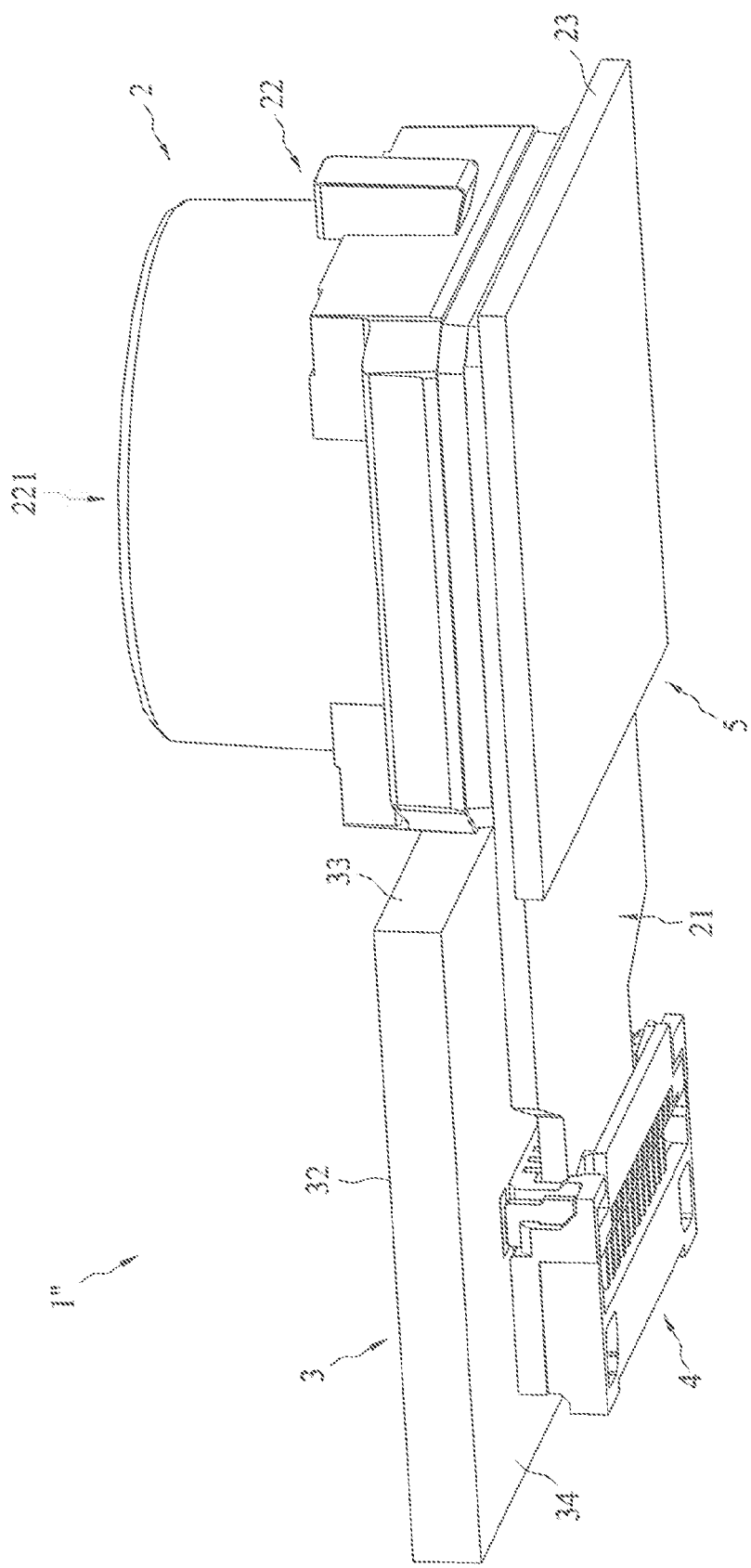
FIG. 9 is a perspective view of another embodiment of an electronic device.
Figure 10:
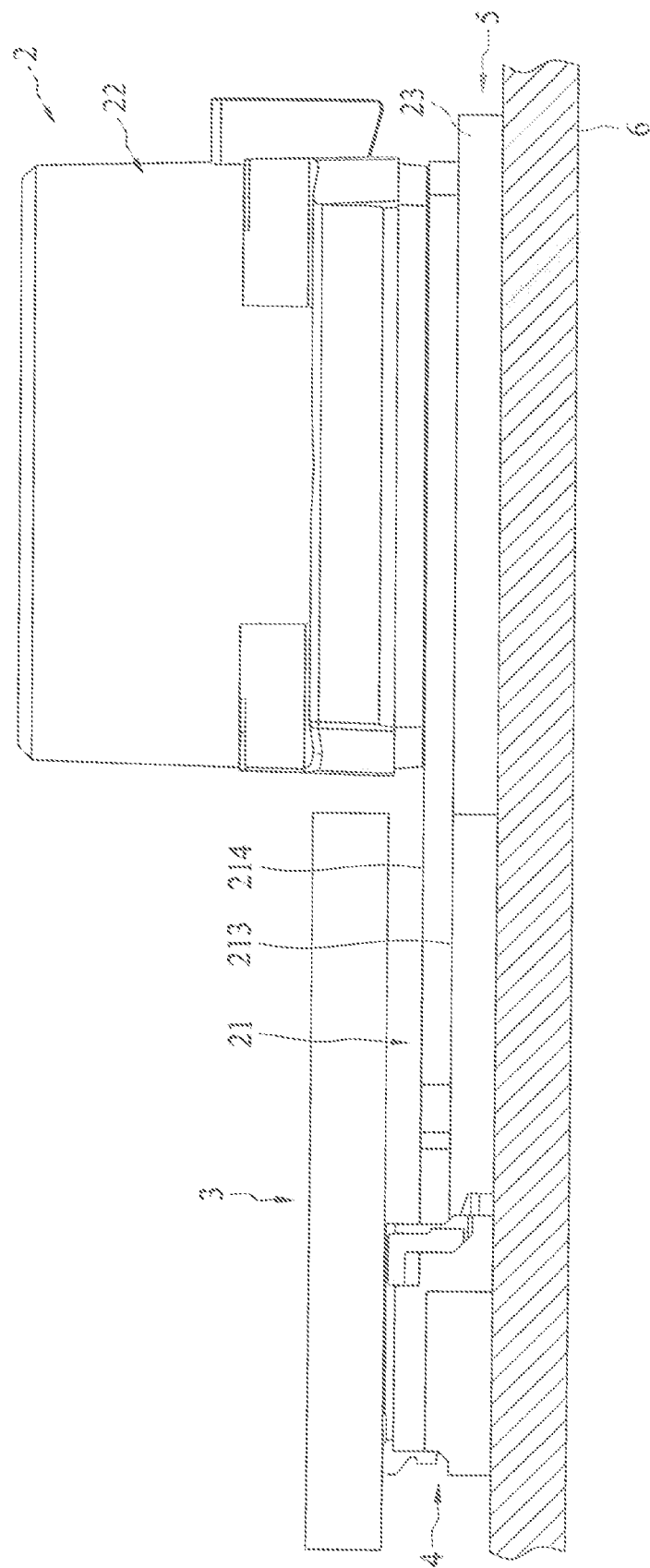
FIG. 10 is an elevated side view of the embodiment depicted in FIG. 9.

FIG. 9 is a perspective view of an electronic device 1". FIG. 10 is a side view of the electronic device 1". Referring to FIG. 9 and FIG. 10, the electronic device 1" comprises a camera device 2, a main circuit board 3, and a board edge connector 4. The light incident surface 221 of the image sensor 22 of the camera device 2 is provided to face upwardly. The main circuit board 3 has an upper board surface 32 and a lower board surface 34, the board edge connector 4 is provided on the lower board surface 34 of the main circuit board 3. After the board edge 2111 of the rigid circuit board 21 of the camera device 2 is mated to the board edge connector 4, the rigid circuit board 21 extends toward the edge 33 of the main circuit board 3 below the lower board surface 34 of the main circuit board 3 to protrude out of the edge 33 of the main circuit board 3; the image sensor 22 of the camera device 2 is positioned on the part of the rigid circuit board 21 protruding out of the main circuit board 3 and is beside the edge 33 of the rigid circuit board 21.

Referring to FIG. 10, the board edge connector 4 can be provided adjacent to the outer casing 6 of the electronic device 1". After the rigid circuit board 21 of the camera device 2 is mated to the board edge connector 4, a heat dissipation space 5 will be left at a position which is below the rigid circuit board 21 and corresponds to the image sensor 22. A heat dissipation member 23 is provided in the heat dissipation space 5, so that the heat dissipation member 23 may be provided between the rigid circuit board 21 and the outer casing 6, thus the heat generated by the camera device 2 can be conducted to the outer casing 6 via the heat dissipation member 23 to escape out of the electronic device 1".

In at least certain embodiments of the present disclosure, the camera device comprises a rigid circuit board, an image sensor and a heat dissipation member. The image sensor is provided on the rigid circuit board. The heat dissipation member is provided correspondingly to the image sensor to assist in heat dissipation from the image sensor which resolves the problem which is difficult to dissipate the heat in existing camera module. The rigid circuit board has a board edge, the board edge is provided with electrical contact pads, the board edge may be mated to the board edge connector. As the rigid circuit board has the ability of being self-supported, after the board edge is mated to the board edge connector a space will be left at a position which is below the rigid circuit board and corresponds to the image sensor so as to facilitate provision of the heat dissipation member. By using the rigid circuit board, not only is there a space for providing the heat dissipation member partitioned from the existing whole space, but also the camera device can occupy a small space and provide a low profile mounting.

Technical contents and technical features of the present disclosure are disclosed as above, but person skilled in the art still may make various substitutions and modifications without departing from the spirit of the disclosure based on the teaching and disclosure of the present disclosure. Therefore, the protection scope of the present disclosure should not be limited to the contents disclosed by the disclosed embodiments as numerous other embodiments, modifications and variations within the scope and spirit of the appended claims will occur to persons of ordinary skill in the art from a review of this disclosure.

What is claimed is:
1. An electronic device, comprising:
a main circuit board with an upper board surface;
a right angle board edge connector provided on the main circuit board; and
a camera device including:
a rigid circuit board with extension portion extending laterally, the extension portion comprising a board edge, the rigid circuit board including a plurality of electrical contact pads provided on the board edge and a bottom surface;
an image sensor including an image capture chip, the image capture chip being supported by the rigid circuit board;

a heat dissipation member provided on the bottom surface, the heat dissipation member aligned with the image capture chip; and an outer casing, the heat dissipation member being positioned between the outer casing and the rigid circuit board, wherein the board edge of the rigid circuit board is mated to the board edge connector provided on the upper board surface of the main circuit board, the rigid circuit board extends above the upper board surface and protrudes past an edge of the main circuit board, the image sensor being positioned on the portion of the rigid circuit board that protrudes past an edge the main circuit board.

2. The electronic device of claim 1, wherein heat dissipation member extends from above the upper board surface to below the upper board surface.

\* \* \* \* \*